(12) United States Patent
Shum et al.

(10) Patent No.: US 10,727,860 B1
(45) Date of Patent: Jul. 28, 2020

(54) INCREASED NOISE PERFORMANCE USING QUANTIZER CODE SUPPRESSION

(71) Applicant: Cirrus Logic International Semiconductor Ltd., Edinburgh (GB)

(72) Inventors: Wai-Shun Shum, Austin, TX (US); Lei Zhu, Austin, TX (US); Johann G. Gaboriau, Austin, TX (US); Xiaofan Fei, Austin, TX (US); Xin Zhao, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/522,033

(22) Filed: Jul. 25, 2019

(51) Int. Cl.
*H03M 3/00* (2006.01)

(52) U.S. Cl.
CPC ............ *H03M 3/416* (2013.01); *H03M 3/346* (2013.01); *H03M 3/436* (2013.01)

(58) Field of Classification Search
CPC ....... H03M 3/416; H03M 3/436; H03M 3/346
USPC .................................................. 341/143, 120
See application file for complete search history.

(56) References Cited

U.S. PATENT DOCUMENTS

| | | | | |
|---|---|---|---|---|
| 8,130,127 B1 * | 3/2012 | Tsang | .................... | H03M 3/322 341/143 |
| 10,491,237 B1 * | 11/2019 | Kim | ........................ | H03M 3/422 |
| 10,498,353 B2 * | 12/2019 | Huang | .................. | H03M 3/428 |
| 10,530,386 B2 * | 1/2020 | Cho | ..................... | H03M 7/3015 |

\* cited by examiner

*Primary Examiner* — Brian K Young
(74) *Attorney, Agent, or Firm* — Jackson Walker L.L.P.

(57) ABSTRACT

A digital delta-sigma modulator may include a loop filter having a loop filter input configured to receive an input signal and generate an intermediate signal responsive to the input signal and a multi-bit quantizer configured to quantize the intermediate signal into a quantized output signal which is fed back as an input to the loop filter. The multi-bit quantizer may further be configured to operate in at least two modes comprising: (a) a normal mode in which, for each sample of the intermediate signal, the multi-bit quantizer generates a corresponding sample having a value selected from a set of a plurality of quantization levels; and (b) a code suppression mode in which, for each sample of the intermediate signal, the multi-bit quantizer generates a corresponding sample having a value selected from a subset of the set of a plurality of quantization levels.

12 Claims, 3 Drawing Sheets

INCREASED NOISE PERFORMANCE USING QUANTIZER CODE SUPPRESSION

FIELD OF DISCLOSURE

The present disclosure relates in general to audio systems, and more particularly, to increasing noise performance in a system using quantizer code suppression within a modulator.

BACKGROUND

A digital delta-sigma modulator may be used in many applications, including without limitation in a pulse-width modulation (PWM) digital-to-analog converter application, wherein quantizer output codes from a multi-bit quantizer of the digital delta-sigma modulator may be used to calculate a duty cycle for a PWM output signal driven to a transducer (e.g., a speaker, haptic actuator, piezoelectric actuator, etc.).

Non-linearities of the transducer driven by the PWM output signal may have a significant impact on noise performance of the digital delta-sigma modulator. Such noise performance degradation may be caused by a number of factors, including inter-symbol interference from clock jitter, driver mismatch, load current, transducer memory, and variation in transducer impedance and phase among different frequencies. Accordingly, techniques to reduce the effect of such non-linearities are desired.

SUMMARY

In accordance with the teachings of the present disclosure, certain disadvantages and problems associated with noise performance in audio systems and other systems may be reduced or eliminated.

In accordance with embodiments of the present disclosure, a digital delta-sigma modulator may include a loop filter having a loop filter input configured to receive an input signal and generate an intermediate signal responsive to the input signal and a multi-bit quantizer configured to quantize the intermediate signal into a quantized output signal which is fed back as an input to the loop filter. The multi-bit quantizer may further be configured to operate in at least two modes comprising: (a) a normal mode in which, for each sample of the intermediate signal, the multi-bit quantizer generates a corresponding sample having a value selected from a set of a plurality of quantization levels; and (b) a code suppression mode in which, for each sample of the intermediate signal, the multi-bit quantizer generates a corresponding sample having a value selected from a subset of the set of a plurality of quantization levels.

In accordance with these and other with embodiments of the present disclosure, a method may include filtering an input signal to generate an intermediate signal responsive to the input signal by a loop filter, quantizing with a multi-bit quantizer the intermediate signal into a quantized output signal which is fed back as an input to the loop filter, wherein the quantizer is configured to operate in at least two modes comprising: (a) a normal mode in which, for each sample of the intermediate signal, the multi-bit quantizer generates a corresponding sample having a value selected from a set of a plurality of quantization levels; and (b) a code suppression mode in which, for each sample of the intermediate signal, the multi-bit quantizer generates a corresponding sample having a value selected from a subset of the set of a plurality of quantization levels.

In accordance with these and other with embodiments of the present disclosure, a digital-to-analog converter may include a digital delta-sigma modulator and a duty cycle calculator. The digital delta-sigma modulator may include a loop filter having a loop filter input configured to receive an input signal and generate an intermediate signal responsive to the input signal and a multi-bit quantizer configured to quantize the intermediate signal into a quantized output signal which is fed back as an input to the loop filter. The multi-bit quantizer may further be configured to operate in at least two modes comprising: (a) a normal mode in which, for each sample of the intermediate signal, the multi-bit quantizer generates a corresponding sample having a value selected from a set of a plurality of quantization levels; and (b) a code suppression mode in which, for each sample of the intermediate signal, the multi-bit quantizer generates a corresponding sample having a value selected from a subset of the set of a plurality of quantization levels. The duty cycle calculator may be configured to, based on the quantized output signal, generate a pulse-width modulated signal equivalent to the input signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
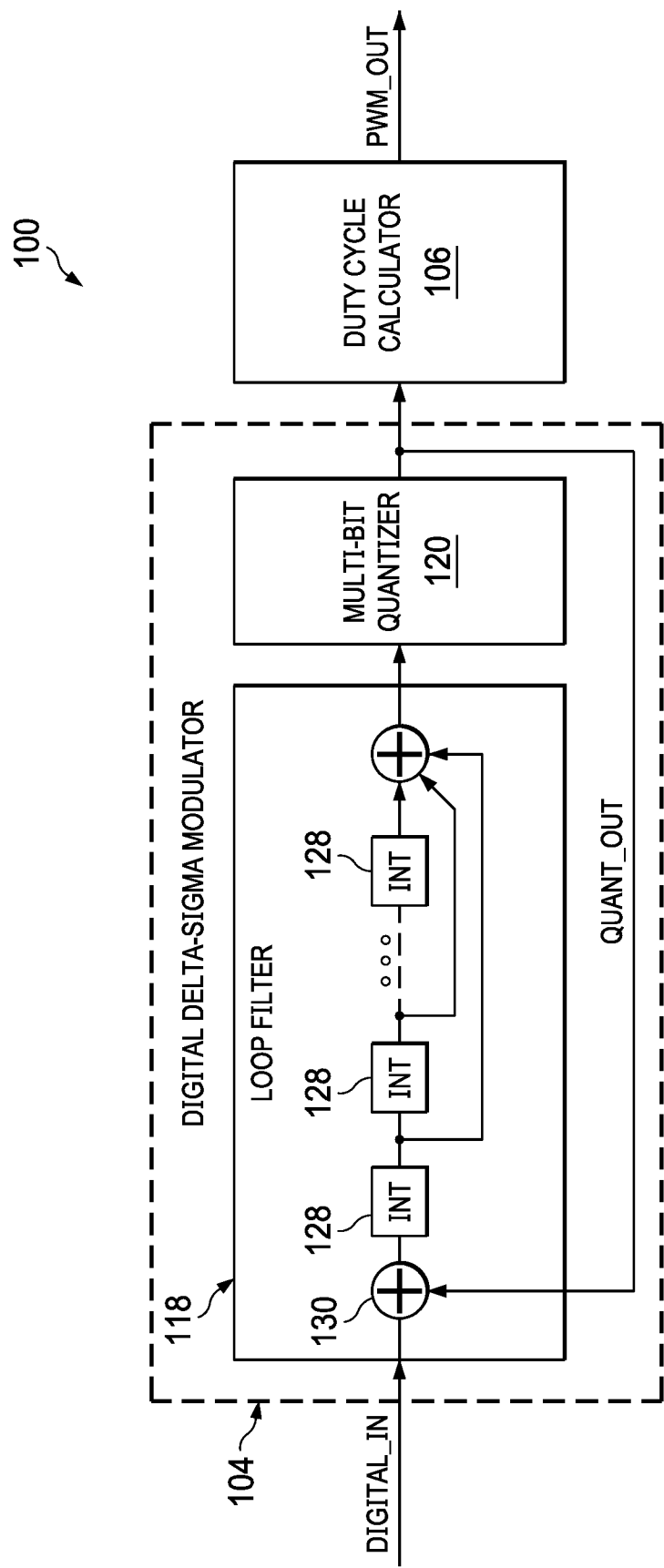
FIG. 1 illustrates a block diagram of selected components of an example PWM digital-to-analog converter, in accordance with embodiments of the present disclosure.

FIG. 1 illustrates a block diagram of selected components of an example PWM digital-to-analog converter (DAC) 100, in accordance with embodiments of the present disclosure. As shown in FIG. 1, DAC 100 may include a digital delta-sigma modulator 104 and a duty cycle calculator 106.

Digital delta-sigma modulator 104 may comprise any suitable system, device, or apparatus configured to receive a digital signal DIGITAL_IN having a plurality of quantization levels to a quantized output signal QUANT_OUT having fewer quantization levels than digital signal DIGITAL_IN, as described in greater detail below. Duty cycle calculator 106 may receive quantized output signal QUANT_OUT, and based thereon, calculate a PWM signal PWM_OUT which is a PWM equivalent to digital signal DIGITAL_IN. Such PWM signal PWM_OUT (in its original form, or as further conditioned and/or amplified) may be driven to an appropriate transducer (e.g., speaker, haptic transducer, piezoelectric transducer, etc.), such that the transducer operates in accordance with PWM signal PWM_OUT (e.g., reproduces sound in accordance with digital signal DIGITAL_IN, reproduces mechanical vibration in accordance with digital signal DIGITAL_IN, etc.).

As shown in FIG. 1, digital delta-sigma modulator 104 may include a loop filter 118, and a multi-bit quantizer 120.

Loop filter 118 may comprise an input summer 130 for generating a difference between digital signal DIGITAL_IN and quantized output signal QUANT_OUT fed back from the output of multi-bit quantizer 120, and one or more integrator stages 128, such that loop filter 118 operates as a filter of an error signal equal to the difference between digital signal DIGITAL_IN and quantized output signal QUANT_OUT, and generates a filtered output digital signal to multi-bit quantizer 120 based on digital signal DIGITAL_IN and quantized output signal QUANT_OUT.

Multi-bit quantizer 120 may comprise any system, device, or apparatus configured to receive the filtered output digital signal from loop filter 118, and quantize the filtered output digital signal into quantized output signal QUANT_OUT having a plurality of quantization levels (e.g., 5). For example, in some embodiments, quantized output signal QUANT_OUT may have quantization levels −2, −1, 0, +1, and +2, wherein each quantization level represents a change between successive samples of digital signal DIGITAL_IN. However, any suitable quantization scheme can be used. Thus, in operation, multi-bit quantizer 120 may receive a filtered output digital signal and based thereon, generate a quantized output signal QUANT_OUT having a value selected from a set of quantization levels.

To mitigate noise caused by inter-symbol interference and/or other causes of noise, multi-bit quantizer 120 may operate in two modes: (a) a normal mode, in which multi-bit quantizer 120 generates quantized output signal QUANT_OUT having a value selected from a set of quantization levels; and (b) a code suppression mode, in which multi-bit quantizer 120 generates quantized output signal QUANT_OUT having a value selected from a smaller subset of the set quantization levels available in the normal mode. For example, in some embodiments, multi-bit quantizer 120 when operating in the normal mode may generate quantized output signal QUANT_OUT having a value selected from the set of quantization levels {−2, −1, 0, +1, +2} and when operating in the code suppression mode may generate quantized output signal QUANT_OUT having a value selected from a subset (e.g., {−2, 0, +2} or {−1, 0, +1}) of the set of quantization levels. By operating in the code suppression mode and limiting the output of multi-bit quantizer 120 to a limited set of codes, multi-bit quantizer 120 may improve noise performance (as compared with operation in the normal mode) by increasing linearity and load-current settling time.

Due to the increased linearity and reduced noise associated with operation in the code suppression mode, it may be desirable to have multi-bit quantizer 120 operate mainly in the code suppression mode. However, there may arise conditions in which it may be desirable to operate in the normal mode. For example, if operation in the code suppression mode is causing loop filter 118 to become unstable or approach instability, it may be desirable for multi-bit quantizer 120 to operate in the normal mode until such time as loop filter stability is restored. As another example, for larger magnitudes of digital signal DIGITAL_IN (e.g., magnitude of digital signal DIGITAL_IN larger than the largest magnitude of quantized output signal QUANT_OUT), it may be desirable for multi-bit quantizer 120 to operate in the normal mode until such time as the magnitude of digital signal DIGITAL_IN returns to targeted signal levels. Thus, multi-bit quantizer 120 may be configured to operate in the normal mode when one or more conditions (e.g., loop filter 118 operating outside of a predetermined range indicative of loop stability, large magnitude of digital signal DIGITAL_IN) exist for operation in the normal mode, and may otherwise operate in the code suppression mode.

Figure 2:
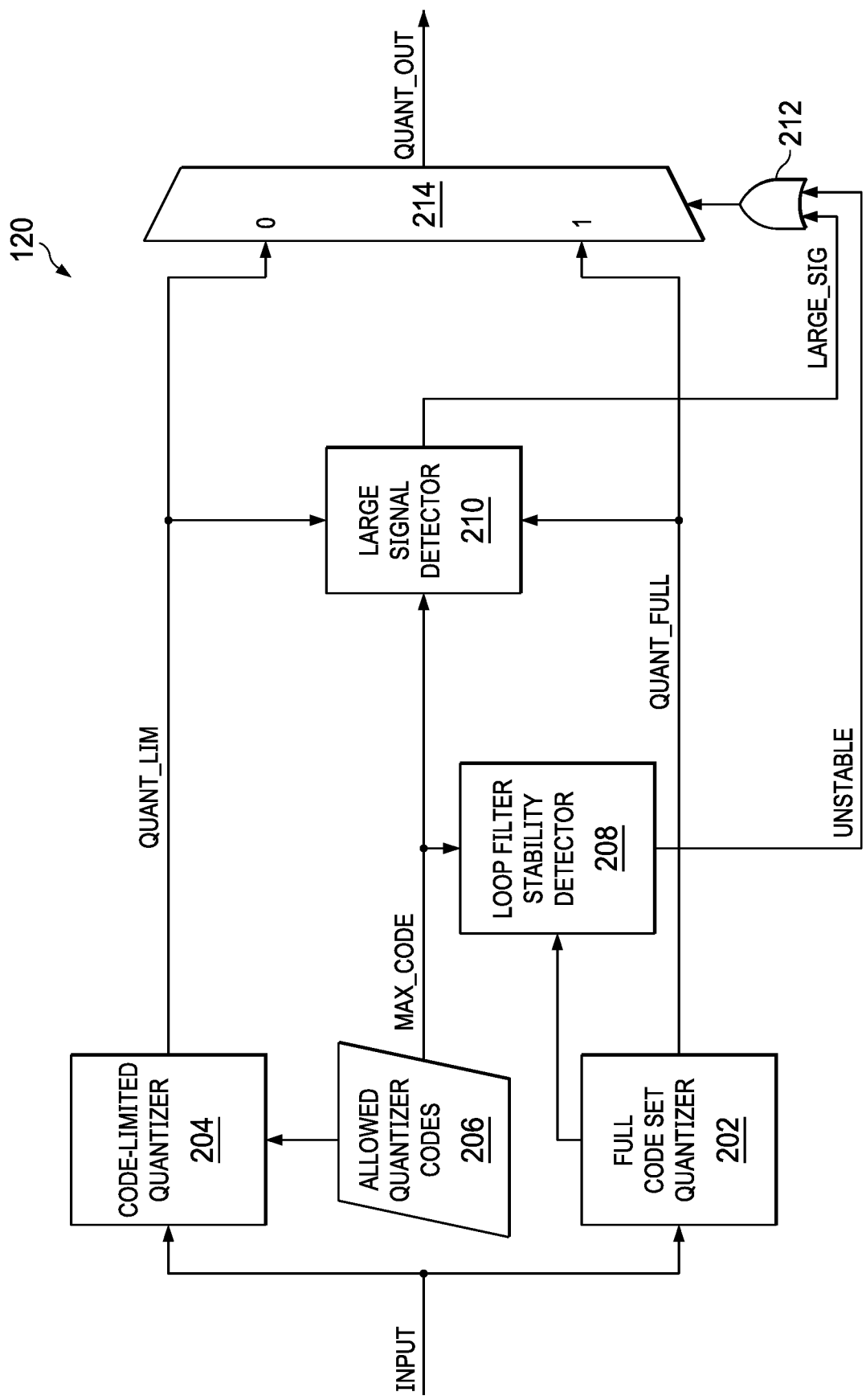
FIG. 2 illustrates a functional block diagram of selected components of a multi-bit quantizer, in accordance with embodiments of the present disclosure.

FIG. 2 illustrates a functional block diagram of selected components of a multi-bit quantizer 120, in accordance with embodiments of the present disclosure. As shown in FIG. 2, multi-bit quantizer 120 may comprise a full code set quantizer 202, a code-limited quantizer 204, a loop filter stability detector 208, a large signal detector 210, a logical OR gate 212, and a multiplexer 214.

Full code set quantizer 202 may receive an input signal INPUT (e.g., the filtered output digital signal from loop filter 118) and quantize input signal INPUT into quantized output signal QUANT_FULL having a set of quantization levels (e.g., 5), and communicate such quantized output signal QUANT_FULL to an input of multiplexer 214. Similarly, code-limited quantizer 204 may receive the input signal INPUT and quantize input signal INPUT into quantized output signal QUANT_LIM having a subset (e.g., 3) of the set of quantization levels available to full code set quantizer 202, and communicate such quantized output signal QUANT_LIM to another input of multiplexer 214. In some embodiments, the available subset of quantization levels available to code-limited quantizer 204 may be stored as allowed quantizer codes 206 in a memory integral to or otherwise available to multi-bit quantizer 120.

Loop filter stability detector 208 may receive an indication of the maximum code MAX_CODE available to code-limited quantizer 204, may receive information from full code set quantizer 202, and may receive any other suitable information (e.g., outputs of one or more integrators 128 of loop filter 118) relevant to stability of loop filter 118, and based thereon, may determine whether loop filter 118 is operating within a predetermined range, wherein operation outside of such predetermined range may indicate that loop filter 118 is unstable or is at risk of becoming unstable. Based on such determination, loop filter stability detector 208 may generate a control signal UNSTABLE indicative of whether loop filter 118 is operating within such predetermined range (e.g., UNSTABLE=1 when loop filter 118 is operating outside of the predetermined range, UNSTABLE=0 when loop filter 118 is operating within the predetermined range).

Large signal detector 210 may receive an indication of the maximum code MAX_CODE available to code-limited quantizer 204, may receive quantized output signal QUANT_FULL and quantized output signal QUANT_LIM, and may receive any other suitable information relevant to the magnitude of input signal INPUT, and based thereon, may determine whether a large magnitude of digital signal DIGITAL_IN is present and generate a signal LARGE_SIG indicative of the presence of a large magnitude of digital signal DIGITAL_IN (e.g., LARGE_SIG=1 when digital signal DIGITAL_IN is large in magnitude, LARGE_SIG=0 when digital signal DIGITAL_IN is nor large).

Logical OR gate 212 may logically OR signal UNSTABLE and signal LARGE_SIG to generate a control signal for selecting which of the inputs of multiplexer 214 is passed as quantized output signal QUANT_OUT. For example, if signal UNSTABLE indicates loop filter operation outside of the predetermined range and/or signal LARGE_SIG indicates presence of a large signal, logical OR gate 212 may provide a control signal to multiplexer 214 such that quantized output signal QUANT_FULL is passed as quantized output signal QUANT_OUT. Otherwise, logical OR gate 212 may provide a control signal to multiplexer 214 such that quantized output signal QUANT_LIM is passed as quantized output signal QUANT_OUT.

Figure 3:
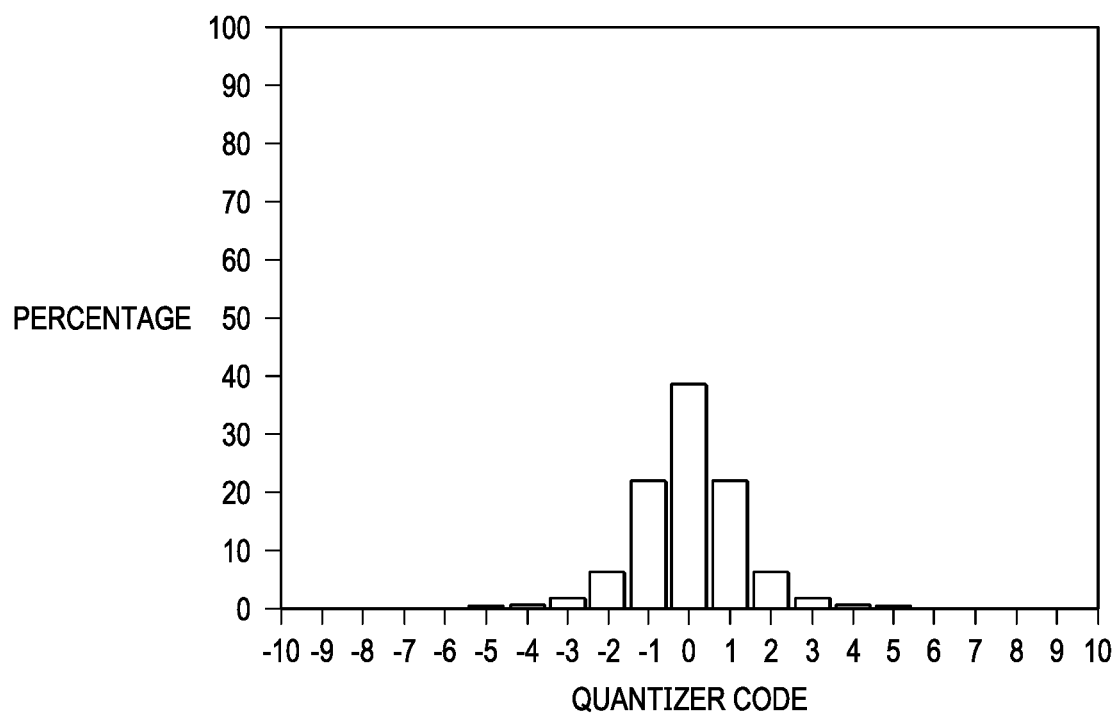
FIG. 3 illustrates an example histogram of a multi-bit quantizer operating in a normal mode, in accordance with embodiments of the present disclosure.
Figure 4:
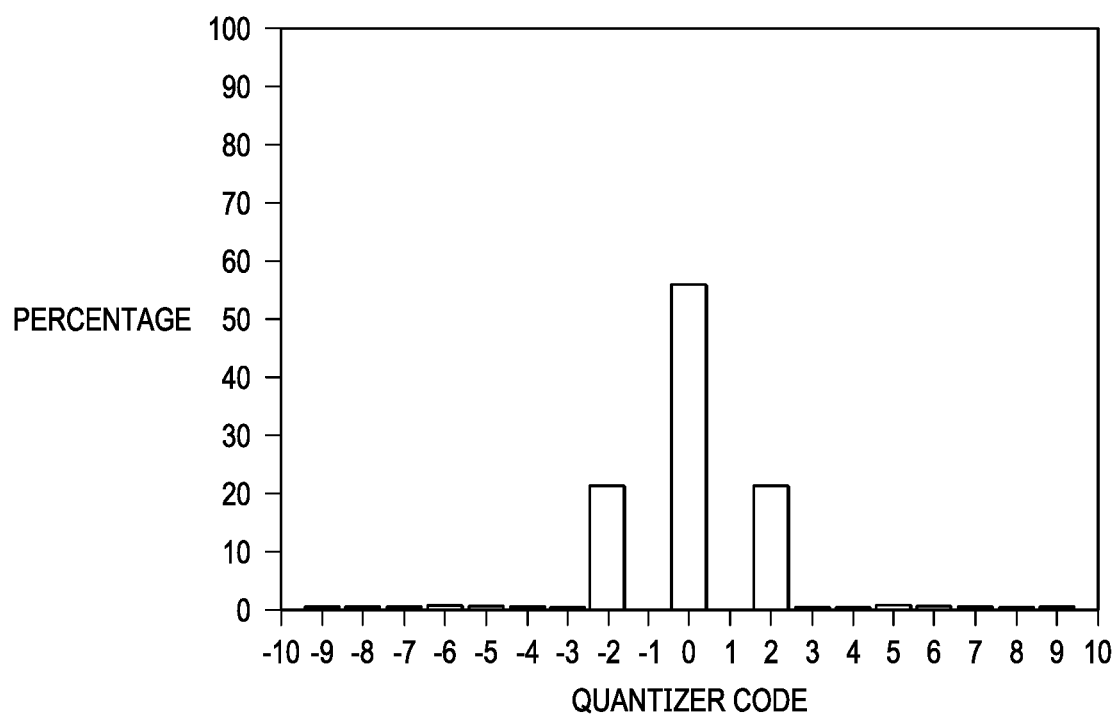
FIG. 4 illustrates an example histogram of a multi-bit quantizer operating in a code suppression mode, in accordance with embodiments of the present disclosure.

To further illustrate operation of multi-bit quantizer 120, FIG. 3 illustrates an example histogram of multi-bit quantizer 120 operating in its normal mode (e.g., quantized output signal QUANT_FULL is passed as quantized output signal QUANT_OUT) and FIG. 4 illustrates an example histogram of multi-bit quantizer 120 operating in its code suppression mode (e.g., quantized output signal QUANT_LIM is passed as quantized output signal QUANT_OUT). Thus, while FIG. 3 shows a full set of quantization levels {−2, −1, 0, +1, and +2} being used by multi-bit quantizer 120 in the normal mode, in the code suppression mode, multi-bit quantizer 120 may use a subset {−2, 0, +2} of the full set of codes used in the normal mode.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A digital delta-sigma modulator comprising:
   a loop filter having a loop filter input configured to receive an input signal and generate an intermediate signal responsive to the input signal;
   a multi-bit quantizer configured to quantize the intermediate signal into a quantized output signal which is fed back as an input to the loop filter and further configured to operate in at least two modes comprising:
      a normal mode in which, for each sample of the intermediate signal, the multi-bit quantizer generates a corresponding sample having a value selected from a set of a plurality of quantization levels; and
      a code suppression mode in which, for each sample of the intermediate signal, the multi-bit quantizer generates a corresponding sample having a value selected from a subset of the set of a plurality of quantization levels.

2. The digital delta-sigma modulator of claim 1, wherein the multi-bit quantizer is further configured to:
   determine whether the loop filter is operating within a predetermined range;
   operate in the code suppression mode responsive to a determination that the loop filter is operating within the predetermined range; and
   operate in the normal mode responsive to a determination that the loop filter is operating outside of the predetermined range.

3. The digital delta-sigma modulator of claim 2, wherein the multi-bit quantizer is further configured to:
   determine a magnitude of the input signal;
   operate in the normal mode responsive to a determination that one or more of the following conditions is present:
      the loop filter is operating outside of the predetermined range and the magnitude is above a threshold magnitude; and
   operate in the code suppression mode responsive to a determination that the loop filter is operating within the predetermined range and the magnitude is below the threshold magnitude.

4. The digital delta-sigma modulator of claim 1, wherein the multi-bit quantizer is further configured to:
   determine a magnitude of the input signal;
   operate in the normal mode responsive to a determination that the magnitude is above a threshold magnitude; and
   operate in the code suppression mode responsive to a determination that the magnitude is below the threshold magnitude.

5. A method comprising:
filtering an input signal to generate an intermediate signal responsive to the input signal by a loop filter;
quantizing with a multi-bit quantizer the intermediate signal into a quantized output signal which is fed back as an input to the loop filter, wherein the quantizer is configured to operate in at least two modes comprising:
- a normal mode in which, for each sample of the intermediate signal, the multi-bit quantizer generates a corresponding sample having a value selected from a set of a plurality of quantization levels; and
- a code suppression mode in which, for each sample of the intermediate signal, the multi-bit quantizer generates a corresponding sample having a value selected from a subset of the set of a plurality of quantization levels.

6. The method of claim 5, further comprising:
determining whether the loop filter is operating within a predetermined range;
operating in the code suppression mode responsive to a determination that the loop filter is operating within the predetermined range; and
operating in the normal mode responsive to a determination that the loop filter is operating outside of the predetermined range.

7. The method of claim 6, further comprising:
determining a magnitude of the input signal;
operating in the normal mode responsive to a determination that one or more of the following conditions is present: the loop filter is operating outside of the predetermined range and the magnitude is above a threshold magnitude; and
operating in the code suppression mode responsive to a determination that the loop filter is operating within the predetermined range and the magnitude is below the threshold magnitude.

8. The method of claim 5, further comprising:
determining a magnitude of the input signal;
operating in the normal mode responsive to a determination that the magnitude is above a threshold magnitude; and
operating in the code suppression mode responsive to a determination that the magnitude is below the threshold magnitude.

9. A digital-to-analog converter comprising:
a digital delta-sigma modulator comprising:
- a loop filter having a loop filter input configured to receive an input signal and generate an intermediate signal responsive to the input signal;
- a multi-bit quantizer configured to quantize the intermediate signal into a quantized output signal which is fed back as an input to the loop filter and further configured to operate in at least two modes comprising:
  - a normal mode in which, for each sample of the intermediate signal, the multi-bit quantizer generates a corresponding sample having a value selected from a set of a plurality of quantization levels; and
  - a code suppression mode in which, for each sample of the intermediate signal, the multi-bit quantizer generates a corresponding sample having a value selected from a subset of the set of a plurality of quantization levels; and
a duty cycle calculator configured to, based on the quantized output signal, generate a pulse-width modulated signal equivalent to the input signal.

10. The digital-to-analog converter of claim 9, wherein the multi-bit quantizer is further configured to:
determine whether the loop filter is operating within a predetermined range;
operate in the code suppression mode responsive to a determination that the loop filter is operating within the predetermined range; and
operate in the normal mode responsive to a determination that the loop filter is operating outside of the predetermined range.

11. The digital-to-analog converter of claim 10, wherein the multi-bit quantizer is further configured to:
determine a magnitude of the input signal;
operate in the normal mode responsive to a determination that one or more of the following conditions is present: the loop filter is operating outside of the predetermined range and the magnitude is above a threshold magnitude; and
operate in the code suppression mode responsive to a determination that the loop filter is operating within the predetermined range and the magnitude is below the threshold magnitude.

12. The digital-to-analog converter of claim 9, wherein the multi-bit quantizer is further configured to:
determine a magnitude of the input signal;
operate in the normal mode responsive to a determination that the magnitude is above a threshold magnitude; and
operate in the code suppression mode responsive to a determination that the magnitude is below the threshold magnitude.

* * * * *